United States Patent [19]

Shimada

[11] Patent Number: 4,907,236
[45] Date of Patent: Mar. 6, 1990

[54] METHOD OF CONTROLLING THE QUANTITY OF LIGHT IN A SELECTED RANGE

[75] Inventor: Kazuyuki Shimada, Tokyo, Japan

[73] Assignee: Ricoh Company, Ltd., Tokyo, Japan

[21] Appl. No.: 322,687

[22] Filed: Mar. 13, 1989

Related U.S. Application Data

[63] Continuation-in-part of Ser. No. 98,603, Sep. 18, 1987, Pat. No. 4,813,046.

[30] Foreign Application Priority Data

Sep. 19, 1986 [JP] Japan .................................. 61-221507
Mar. 31, 1988 [JP] Japan .................................. 63-76339

[51] Int. Cl.⁴ ............................................... H01S 3/13
[52] U.S. Cl. ......................................... 372/31; 372/38
[58] Field of Search ............................... 372/29, 31, 38

[56] References Cited

U.S. PATENT DOCUMENTS 4,745,609  5/1988  Yoshikawa ........................ 372/31
4,817,098  3/1989  Horikawa ......................... 371/31

Primary Examiner—William L. Sikes
Assistant Examiner—Robert E. Wise
Attorney, Agent, or Firm—Cooper & Dunham

[57] ABSTRACT

The intensity of a laser beam used for writing on a photosensitive surface is controlled to keep it at a selected level between upper and lower detected intensity levels regardless of differences in the driving current versus light output characteristics due to aging and due to manufacturing tolerances as between different lasers.

5 Claims, 4 Drawing Sheets

Preset digital level D for laser emission intensity

METHOD OF CONTROLLING THE QUANTITY OF LIGHT IN A SELECTED RANGE

REFERENCE TO RELATED APPLICATION

This application is a continuation-in-part of copending parent application Ser. No. 098,603, now U.S. Pat. No. 4,813,046 filed Sept. 18, 1987 and entitled OPTICAL SCANNING METHOD, which is hereby incorporated in its entirety in this application as though fully set forth herein.

BACKGROUND AND OBJECTS OF THE INVENTION

The present invention relates to a method of controlling the quantity of light in a selected range in applications using a semiconductor laser for writing data, as in a laser printer, a laser facsimile transmitter/receiver, a digital copying machine, and the like.

In a laser printer which employs a semiconductor laser, it has been customary to vary the printing (image) density of a hard copy as follows:

The intensity of light emitted from the semiconductor laser is detected, and the detected light intensity (voltage Vx) is compared with a preset reference level (reference voltage Vref). The level of a drive current applied to the semiconductor laser is controlled, based on the result of the comparison, by a feedback control loop provided by an automatic power control (APC) circuit so that the light emission intensity will correspond to the reference value (see Japanese Laid-Open Patent Publication No. 62-116071).

More specifically, a controlled power level (initial level) achieved by the APC and a preset emission intensity level are added, and the drive current for the semiconductor laser is determined based on the sum through a D/A converter. The preset emission intensity level is of a digital value of "100000", for example, and converted by the D/A coverter into analog value. The value of the drive current for the semiconductor laser may be expressed as $\Delta i/DATA = 100000$.

Since the D/A converter has a constant gain, $\Delta i$ is proportional to the digital value at a constant gradient as shown in FIG. 3.

One characteristic of a semiconductor laser is its differential efficiency $\eta$ defining the gradients of straight-line curves X, Y (FIG. 4(I)) which represent the relationship between emission intensities P (on the vertical axis) and drive currents I (on the horizontal axis). The differential efficiency $\eta$ indicates the gradient of the light emission output with respect to the drive current. This characteristic tends to vary from semiconductor laser to semiconductor laser even if the lasers are of the same type, and also tends to vary with time even for the same semiconductor laser.

Where the above process of driving the semiconductor laser based on the sum of the initial level and the preset emission intensity level is employed for setting an emission intensity level, emission intensity levels may vary from laser to laser.

As described above, with the conventional light control process, the initial level and the preset intensity level are added for driving the semiconductor laser. Therefore, the light emission intensity can vary from laser to laser dependent on setting conditions, and this can make it difficult to print hard copy with good density.

It is an object of the present invention to provide a multilevel light quantity control method which will eliminate the aforesaid problems and can establish a light emission intensity level highly accurately regardless of different characteristics of semiconductor lasers and time-dependent changes thereof, in variably controlling the quantity of output light emitted from a semiconductor laser within a range (between first and second reference levels). Another object is to otherwise impose print quality.

SUMMARY OF THE INVENTION

To achieve the above objects, there is provided in accordance with the present invention a method of controlling the quantity of light emitted from a semiconductor laser within a selected range, comprising the steps of: producing a digital reference level signal for setting the light emission intensity of the semiconductor laser for scanning a medium to optically write information thereon, to a first reference level, with a first output emission intensity control circuit; producing a digital extent-of-correction control signal for setting the light emission intensity to a second reference level, with a second output emission intensity control circuit; producing a digital power level setting signal for setting the light emission intensity to a level ranging from said first reference level to said second reference level, with a power level setting circuit; adjusting the gain of a first D/A converter for converting the digital power level setting signal into an analog power level setting signal, with said extent-of-correction control signal as converted into an analog signal by a second D/A converter; applying said analog power level setting signal and said reference level signal as converted into an analog reference level signal by a third D/A converter to a processing unit to process said analog reference level signal with said analog power level setting signal thereby producing an analog signal; and modulating said last-mentioned analog signal with a modulating signal to drive the semiconductor laser.

With the arrangement of the present invention, the light emission intensity of the semiconductor laser for scanning a medium to optically write information thereon is set to the first reference level by the digital reference level signal which is produced by the first output emission intensity control circuit. The light emission intensity is also set to the second reference level by the extent-of-correction control signal which is produced by the second output emission intensity control circuit. For varying the light emission intensity of the semiconductor laser in the range from the first reference level to the second reference level, e.g., for adjusting the printing (image) density in a laser printer, a laser facsimile transmitter/receiver, a digital copying machine, or the like, the digital power level setting signal is produced by the power level setting circuit.

The power level setting signal is converted into the analog signal by the first D/A converter. The extent-of-correction control signal is converted into the analog signal by the second D/A converter. The reference level signal is converted into the analog signal by the third D/A converter.

The gain of the first D/A converter is adjusted by the analog extent-of-correction control signal. The analog power level setting signal and the reference level signal are applied to the processing circuit which then produces the analog signal that is modulated by the modulating signal to drive the semiconductor laser.

DETAILED DESCRIPTION

As is well known in the art the light emission intensity P of a semiconductor laser varies linearly with a drive supply I supplied thereto. Therefore, the light emission intensity P can be controlled by controlling the drive current I.

Figure 4I:
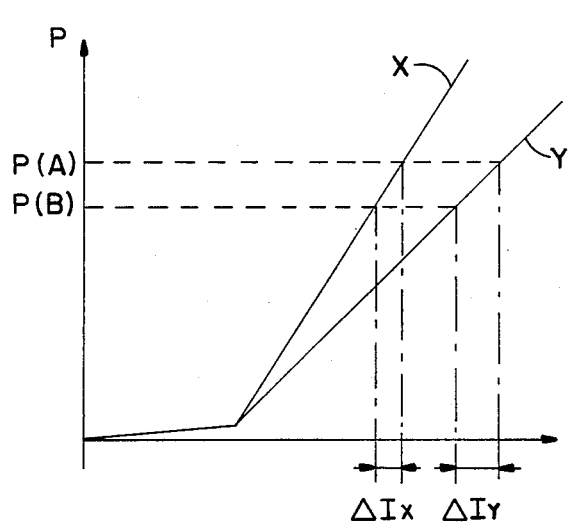
FIG. 4(I) is a graph showing the relationship between the light emission intensities P of semiconductor lasers and drive currents I supplied thereto.
Figure 4:
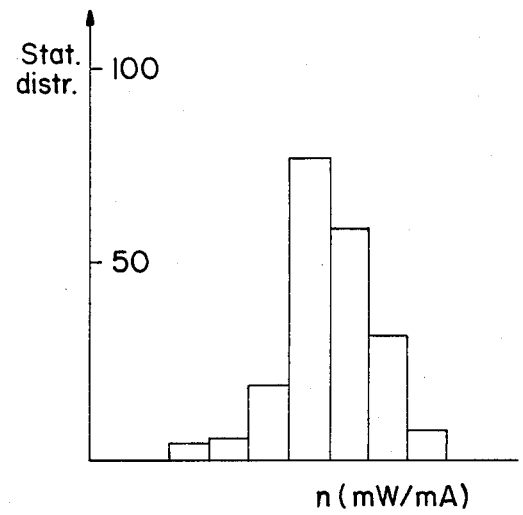
FIG. 4(II) is a graph showing a distribution of differential efficiencies $\eta$ of semiconductor lasers.

The straight-line curves X, Y shown in FIG. 4(I) show how the light emission intensities P of semiconductor lasers and the drive currents supplied thereto are related to each other, the gradient of each of the straight-line curves X, Y being called a differential efficiency $\eta$. It is known that the differential efficiency varies from semiconductor laser to semiconductor laser even if the lasers of the same type. An exemplary statistical distribution is shown in FIG. 4(II).

With the semiconductor laser having a P-I characteristic indicated by X in FIG. 4(I), for obtaining a light emission intensity P(B), the drive current to be supplied should be made $\Delta Ix$ smaller than for obtaining a light emission intensity P(A). Where a semiconductor laser has a P-I characteristic Y, light emission intensity P(B) can be achieved if the laser is supplied with drive current which is $\Delta Iy$ smaller than for obtaining light emission intensity P(A).

An embodiment of the present invention resides in providing a power level setting circuit for controlling the drive current supplied to a semiconductor laser to obtain a desired light emission intensity.

Figure 5:
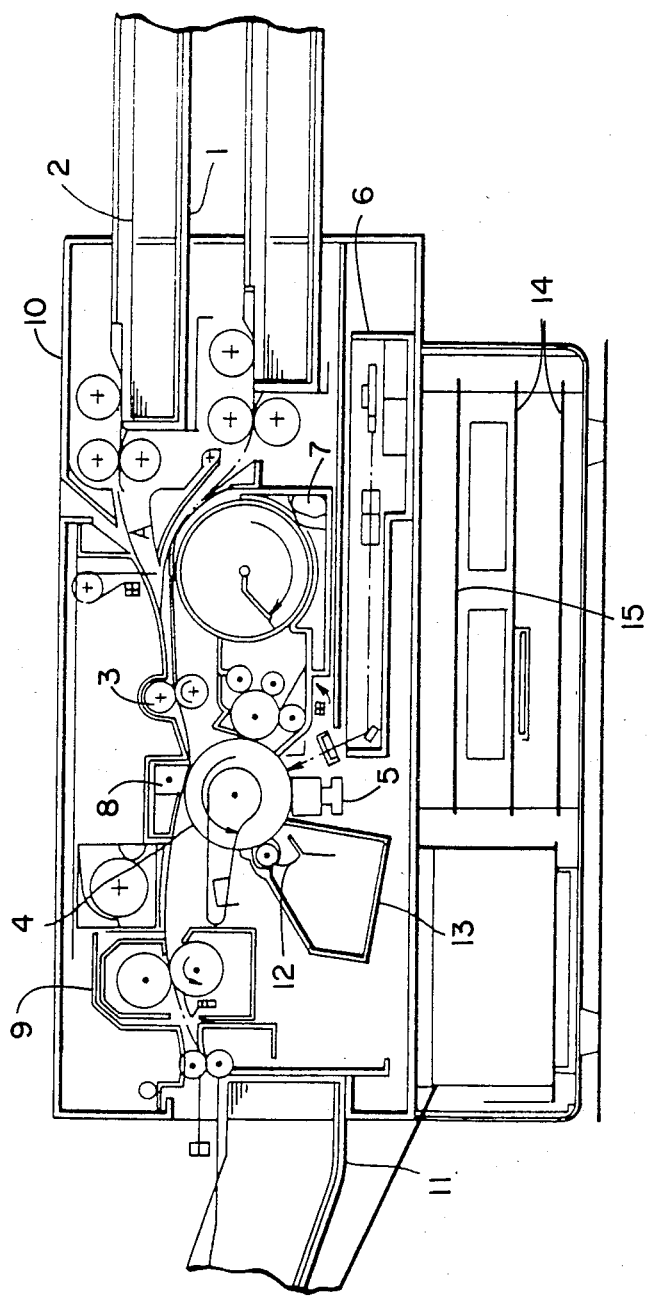
FIG. 5 is a schematic cross-sectional view of a laser printer to which the present invention is applied.

FIG. 5 schematically shows in a cross section a laser printer incorporating the principles of the present invention. A recording sheet of paper 2 fed from a sheet feeder 1 in the direction of the arrow A is controlled in its timing by resist rollers 3, and then delivered toward a latent image carrier comprising a drum-shaped photosensitive body 4.

The photosensitive body 4 is rotated counterclockwise about its own axis while at the same time its circumferential surface is charged by a charger 5 and then irradiated with a laser beam from a laser optical system 6 to form an electrostatic latent image on the photosensitive body 4.

When the latent image goes through a developing device 7, it is visualized by toner. The visible toner image is then transferred by a transfer charger 8 onto the recording sheet 2 which has been delivered to the photosensitive body 4. The transferred visible image on the recording sheet 2 is then fixed thereto by a fixing device 9. The recording sheet 2 which has left the fixing device 9 is fed onto a discharge tray 11 in the direction of the arrow B.

After the visible image has been transferred, any remaining toner on the photosensitive body 4 is removed by a cleaning device having a cleaning blade 12. The toner removed from the photosensitive body is retrieved and stored in a toner storage tank 13. Denoted at 10 is a printer housing, 14 a controller, and 15 a print control unit.

Figure 1:
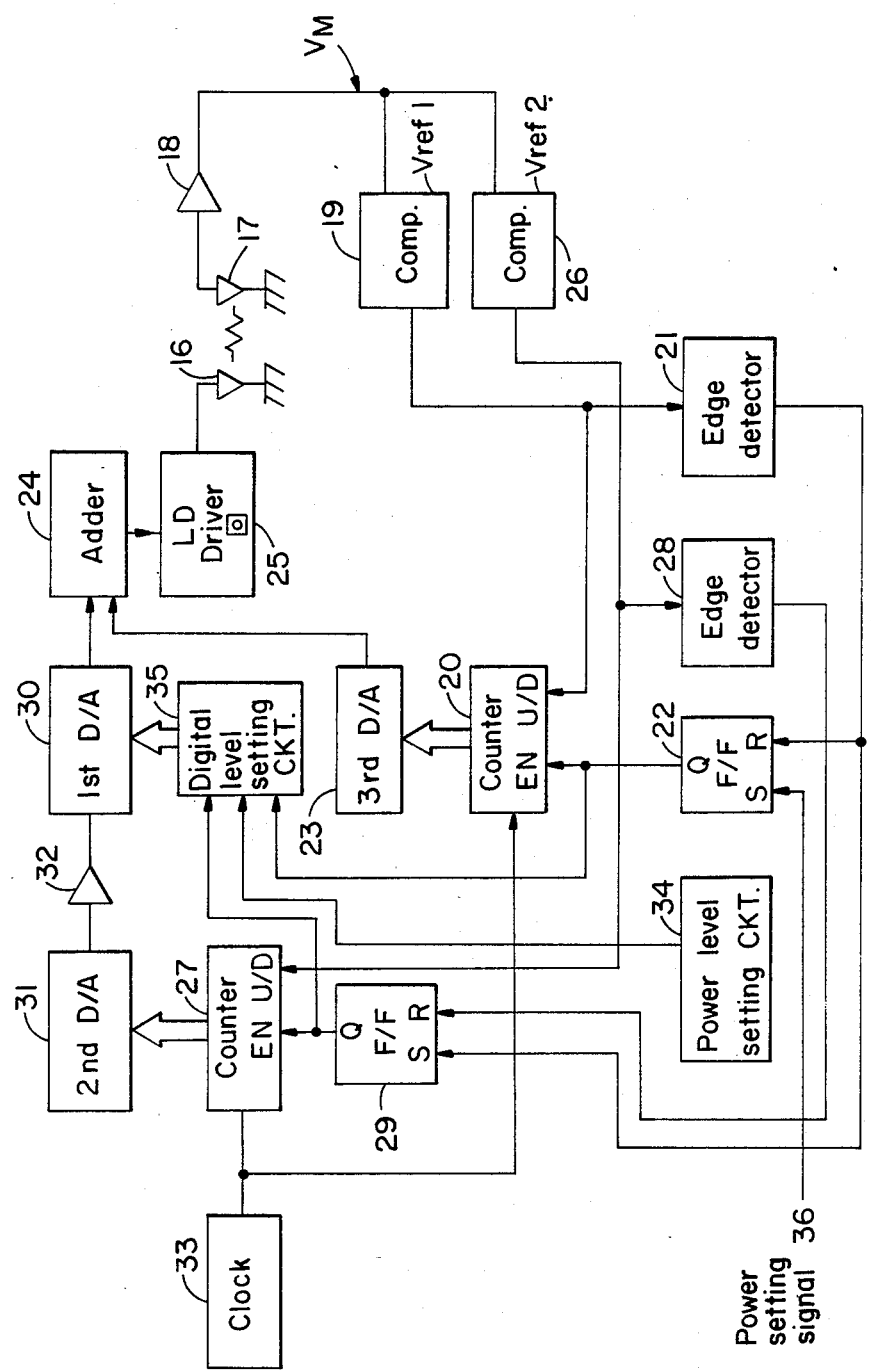
FIG. 1 is a block diagram of an apparatus for carrying out a method of the present invention.

FIG. 1 shows in block form an apparatus for carrying out the method of the present invention.

The apparatus has a semiconductor laser 16, a photosensor 17, an amplifier 18, a comparator 19 for comparing a reference voltage $Vref_1$, with a voltage VM converted from the intensity of light detected by the photosensor 17, an up/down counter 20 with its count mode controlled by a high or low level (U/D) signal dependent on the levels of the voltage $V_M$ and the reference voltage $Vref_1$, applied to the comparator 19, for counting up or down clock pulses from a clock pulse generator 33, an edge detector 21 for detecting a positive-going edge or a negative-going edge of the output signal from the comparator 19, a flip-flop 22 for resetting the counter 20 to a disable state in response to the output signal from the edge detector 21, a third D/A converter 23, and an adder 24, a semiconductor laser (LD) driver 25. The components indicated by the reference numerals discussed above jointly constitute a first output emission intensity control circuit.

The apparatus also includes comparator 26 for comparing the voltage $V_M$ and a reference voltage $Vref_2$, an up/down counter 27 with its count mode controlled by a high or low level (U/D) dependent on the levels of the voltage $V_M$ and the reference voltage $Vref_2$ applied to the comparator 26, for counting up or down clock pulses from the clock pulse generator 33, and edge detector 28 for detecting a positive-going edge or negative-going edge of the output signal from the comparator 26, a flip-flop 29 for resetting the counter 27 to a disable state in response to the output signal from the edge detector 28, first and second D/A converters, 30, 31, and an amplifier 32. The photosensor 17, the amplifier 18, the components indicated by the reference numerals 26 through 36, the adder 24, and the LD driver 25 jointly constitute a second output emission intensity control circuit According to the present invention, the apparatus includes a power level setting circuit 34. A digital level setting circuit 35 is responsive to an output signal from a flip-flop 29 for issuing a digital level set by the power level setting circuit 34 to the first D/A converter 30.

Operation of the above apparatus will be described below. First, the generation of reference level signals will be described.

A constant drive signal (not shown) is applied to the LD driver 25 for driving the semiconductor laser 16 to enable the latter to emit laser beams of constant emission intensity in forward and rearward directions.

The laser beam emitted in the rearward direction of the semiconductor laser 16 is detected by the photosensor 17. The photosensor 17 then produces a current proportional to the intensity of the detected laser beam. The current from the photosensor 17 is converted by the amplifier 18 into a voltage which is applied as the voltage level $V_M$ to the comparators 19, 26 for comparison with the reference voltages $Vref_1$, $Vref_2$. The output voltage from the comparator 19 is of high or low level dependent on the magnitude relationship between the voltages $V_M$ and $Vref_1$ for controlling the count mode of the counter 20. For example, if $V_M < Vref_1$, i.e., if the light emission intensity of the semiconductor laser 16 has not yet reached the reference level P(A) shown in FIG. 4(I), then the output level of the comparator 19 is low, and the counter 20 operates as an up counter in an up-counter mode. Conversely, if $V_M>$Vref$_1$, then the counter 20 operates as a down counter in a down-counter mode.

The flip-flop 22 is set by a power setting signal 36 for starting to control the quantity of light emitted by the semiconductor laser (LD) 16, to produce an output signal to enable the counter 20. This flip-flop 22 also enables the digital level setting circuit 35 to produce a digital level corresponding to the first reference level, which is converted by the first D/A converter 30 into an analog signal that is applied to the adder 24. The counter 20 counts up or down clock pulses from the clock pulse generator 33 dependent on the input signal from the comparator 19.

The count output of the counter 20 is converted by the third D/A converter 23 into an analog signal that is applied to the adder 24 and then to the LD driver 25 to vary the drive signal. The light emission intensity of the semiconductor laser 16 is now varied.

As the count of the counter 20 is gradually increased or reduced, the intensity of the laser beam emitted from the semiconductor laser 16 is gradually increased or reduced, and so is the voltage $V_M$ applied to the comparator 19.

When the magnitude relationship between the voltage $V_M$ and the reference voltage Vref$_1$ becomes reversed as a result of the gradual increase or reduction in the voltage $V_M$, the output level of the comparator 19 goes high or low. The edge detector 21 then detects a positive-going or negative-going edge of the output signal from the comparator 19, resetting the flip-flop 22 to disable the counter 20. Therefore, the counter 20 holds the count when the output signal from the comparator 19 is reversed, and hence the magnitude of the drive current for the semiconductor laser 16. At this time, the voltage $V_M$ is substantially equal to the reference voltage Vref$_1$, and the light emission intensity of the semiconductor laser 16 is set to the first reference voltage level P(A) which has been established by the reference voltage Vref$_1$. With the light emission intensity of the semiconductor laser 16 being set to the first reference level P(A), the digital signal issued from the counter 20 serves as a reference level signal.

The edge detector 21 may be arranged such that it disables the counter 20 only when the output signal of the comparator 19 switches from a low level to a high level. With this modified arrangement, the apparatus operates in the same way as described above when the output level of the comparator 19 goes high. However, when the output level of the comparator 19 goes low, the apparatus operates as follows: When the output level of the comparator 19 goes low, the counter 20 remains enabled and operates as an up counter. The drive current for the semiconductor laser 16 increases until the output level of the comparator 19 goes high, whereupon the edge detector 21 detects a positive-going edge to disable the counter 20, allowing the counter 20 to hold its count.

The counter 20 may be arranged such that it operates as a down counter when the output signal of the comparator 19 is of a low level and as an up counter when the output signal of the comparator 19 is of a high level, making the count of the counter 20 inversely proportional to the drive current for the semiconductor laser 16. The above modifications described with respect to the edge detector 21 and the counter 20 also hold true for the edge detector 28 and the counter 27.

When the flip-flop 22 is reset, the counter 20 is disabled, and also a digital value corresponding to a second reference level is issued from the digital level setting circuit 35.

The components ranging from the photosensor 17 to the LD driver 25 serve as the first output emission intensity control circuit for converting digital values corresponding to the first and second reference levels into analog values and applying the analog values to the LD driver 25.

At the same time that the output signal from the edge detector 21 resets the flip-flop 22, as described above, the output signal from the edge detector 21 also sets the flip-flop 29. The flip-flop 29 produces an output signal to enable the counter 27. Therefore, at the same time that the light emission intensity of the semiconductor laser 16 reaches the first reference level P(A), the counter 27 counts up or down clock pulses from the clock pulse generator 33 dependent on whether the output level of the comparator 26 is low or high.

The count output from the counter 27 is converted by the second D/A converter 31 into an analog signal which is applied via the amplifier 31, the first D/A converter 30, and the adder 24 to the LD driver 25. As the count of the counter 27 is increased or reduced, the intensity of the laser beam emitted from the semiconductor laser 16 is also increased or reduced. When the light emission intensity reaches the second reference level P(B) which has been established by the reference voltage Vref$_2$, this fact is detected as an output level reversal of the comparator 26 by the edge detector 28, which issues an output signal to reset the flip-flop 29. The counter 27 is now disabled to keep its output count reached when the second reference level P(B) is achieved. The output count of the counter 27 at this time serves as an extent-of-correction control signal.

The photosensor 17, the amplifier 18, the components 26-32, the adder 24, and the LD driver 25 thus serve as the second output emission intensity control circuit for obtaining the extent-of-correction control signal to set the light emission intensity to the second reference level.

In response to the output signal from the flip-flop 29, the digital level setting circuit 35 issues a digital level set by the power level setting circuit 34 to the first D/A converter 30.

The first and second reference levels P(A), P(B) are determined as design conditions for the extent to which the quantity of light to be emitted is variable. The difference $\Delta I$, giving the difference P(A)−P(B), between drive currents as shown in FIG. 4(I) varies dependent of the differential efficiency $\eta$ of a semiconductor laser used. Therefore, the magnitude of the extent-of-correction control signal corresponds to the differential efficiency $\eta$ of the semiconductor laser 16.

The digital extent-of-correction control signal thus obtained from the counter 27 is converted by the second D/A converter 31 into an analog signal which is then applied via the amplifier 32 to the first D/A converter 30 to vary the gain of the first D/A converter 30 in proportion to the magnitude of the extent-of-correction control signal.

The reference level signal and the extent-of-correction control signal can vary each time the power setting signal is applied, but remain unchanged after a power setting signal has been applied until next power setting signal is applied.

As is apparent from the above description, the reference level signal is determined based on the first reference level P(A) for the light emission intensity of the semiconductor laser 16, and the setting signal is determined by the preset power level from the power level setting circuit 34. Both of the reference level signal and the setting signal do not contain information about the differential efficiency η of the semiconductor laser 16.

If the gain of the first D/A converter 30 were constant, then the digital light emission intensity with which laser power corresponding to the second reference level is to be emitted would tend to vary from the prescribed intensity P(B) due to a different differential efficiency η or a time-dependent variation of the differential efficiency η. Thus, the light emission intensity of the semiconductor laser 16 would be shifted from the digital level corresponding to the first reference level to the digital level corresponding the second reference level.

According to the present invention, however, the gain of the first D/A converter 30 is adjusted to achieve the light emission intensity P(B) dependent on the differential efficiency η by the extent-of-correction control signal (the output signal, as converted into the analog value, from the counter 27) containing information with respect to the differential efficiency η. Therefore, a desired light emission intensity may be obtained which range from the first reference level to the second reference level.

Figure 2:
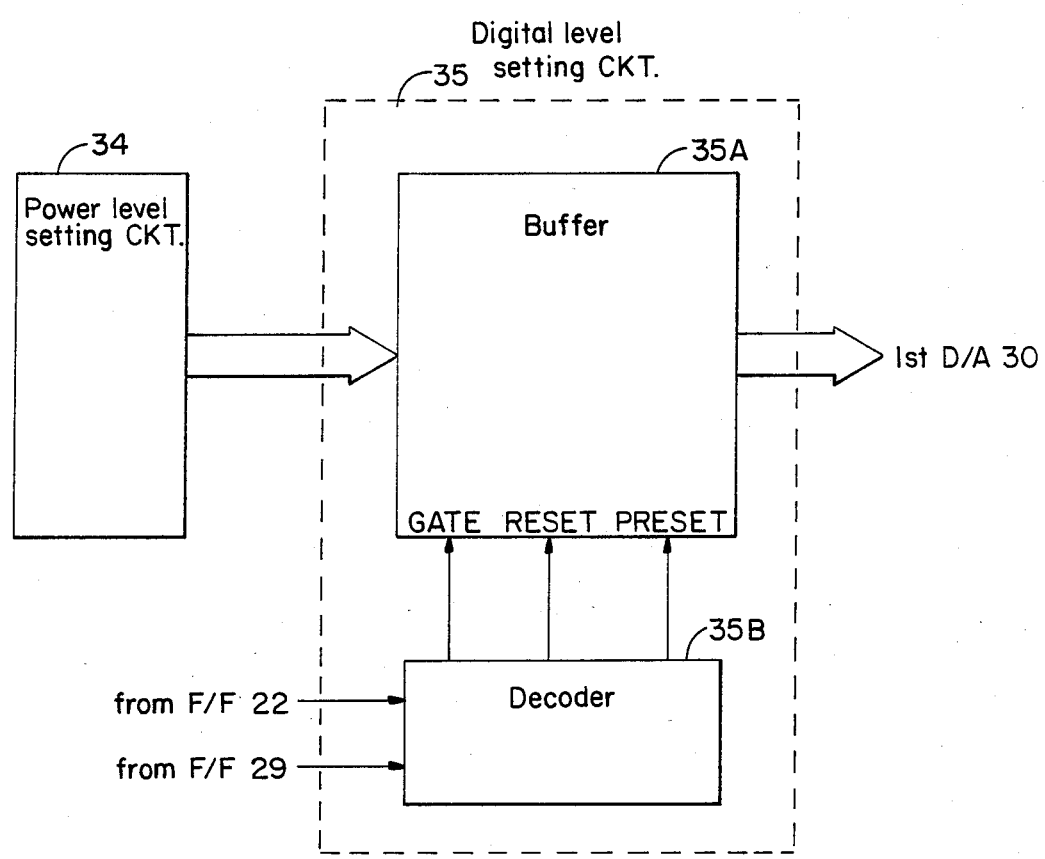
FIG. 2 is a block diagram of a digital level setting circuit 35 shown in FIG. 1.
Figure 3:
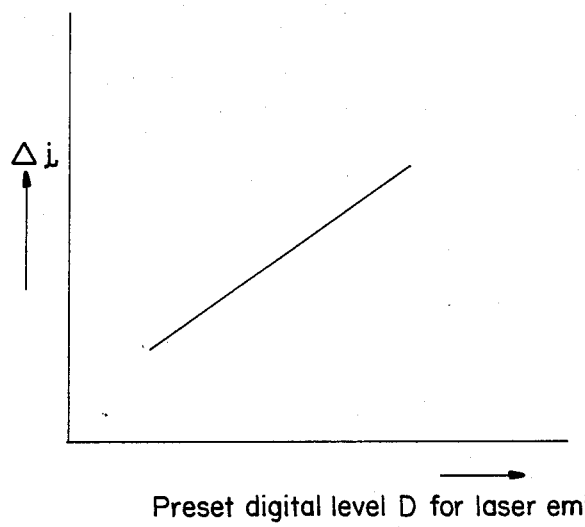
FIG. 3 is a graph showing the relationship between a current $\Delta i$ for driving a semiconductor laser and a preset digital level D for the light emission intensity of the laser.

FIG. 2 shows in detail the digital level setting circuit 35 illustrated in FIG. 1. The digital level setting circuit 35 includes a buffer 35A having a gate input terminal, a reset input terminal, and a preset input terminal, and a decoder 35B to which the output signals from the flip-flops 22, 29 are applied. Output signals from the decoder 35B are applied to the buffer 35A. The power level setting signal from the power level setting circuit 34 is applied as an input signal to the buffer 35A.

The digital value corresponding to the first reference level or the digital value corresponding the second reference level, from the flip-flops 22, 29, is decoded by the decoder 35B, or the output signal from the power level setting circuit 34 is applied to the buffer 35A, and the output signal from the buffer 35A is then applied to the first D/A converter 30.

With the present invention, the power level of the semiconductor laser 16 is automatically controlled at the first reference level when the power setting signal 36 is produced. Subsequently, if the semiconductor laser 16 is stable with respect to temperature, the power level of the semiconductor laser 16 is not required to be automatically controlled at the second reference level each time the power setting signal is applied. When the automatic power level control is to be effected with respect to the first and second reference levels, the automatic power level control with respect to the second reference level may be performed either each time the power setting signal is applied or at suitable times. The first and second reference levels may be selected such that either P(A)<P(B) or P(A)>P(B).

The power level setting circuit 34 may be set to a desired power level manually or automatically by a CPU. The laser beam emitted by laser 16 can be modulated with an information signal in a manner known in the art to thereby write information on photosensitive drum 4 or on some other medium.

According to the present invention, as described above, each time the power setting signal 36 is applied and set, the first and second reference levels P(A), P(B) are automatically established with respect to the laser power output. Therefore, a desired laser output level may be obtained which ranges from the first reference level to the second reference level.

As a result, a desired laser output level can be established with accuracy irrespective of different characteristics or time-dependent variations in characteristics of semiconductor lasers.

What is claimed is:

1. A method of controlling the quantity of light emitted from a semiconductor laser, comprising the steps of: producing a digital reference level signal for setting the light emission intensity of the semiconductor laser for scanning a medium to optically write information thereon, to a first reference level, with a first output emission intensity control circuit; producing a digital extent-of-correction control signal for setting the light emission intensity to a second reference level, with a second output emission intensity control circuit; producing a digital power level setting signal for setting the light emission intensity to a level ranging from said first reference level to said second reference level with a power level setting circuit; adjusting the gain of a first D/A converter for converting the digital power level setting signal into an analog power level setting signal, with said extent-of-correction control signal as converted into an analog signal by a second D/A converter; applying said analog power level setting signal and said reference level signal as converted into an analog reference level signal by a third D/A converter to a processing unit to process said analog reference level signal with said analog power level setting signal thereby producing an analog signal; and modulating said last-mentioned analog signal with a modulating signal to drive the semiconductor laser.

2. A method of controlling the detected intensity of the light emitted by a laser used to form a latent image on a photosensitive medium such that said detected intensity remains within a selected range despite variations in the efficiency of the laser comprising the steps of:

providing a first reference signal which corresponds to a first level of said detected intensity and a second reference signal which corresponds to a second selected level of said detected intensity;

powering up a laser driving circuit which provides driving current to said laser and varying said driving current to reach a first current level causing said laser to emit light whose detected intensity is at said first level;

further varying said driving current to reach a second current level causing said laser to emit light whose detected intensity is at said second level;

providing an initial intensity control signal which is at a selected level within a selected initial range;

changing the level of said initial intensity control signal as a function of the difference between said first and second current levels to thereby derive a final intensity control signal; and controlling the driving current supplied to said laser as a function of at least said final control signal.

3. A method as in claim 2 in which said controlling step comprises controlling the driving current supplied to said laser as a function both of said final control signal and said first reference signal.

4. A method as in claim 3 in which the driving current supplied to said laser corresponds to the sum of a driving current at said first level and an increment determined by said final control signal.

5. A system comprising a photosensitive medium, a laser generating a beam for writing on said medium, a detector measuring the intensity of said beam to generate a detected intensity signal and a beam intensity regulating circuit comprising a source of a first reference signal and of a second reference signal, a first level control circuit responsive to said first reference signal and said detected intensity signal to generate a first driving current which, when supplied to said laser causes said laser to generate a beam having a first intensity level, a second level control circuit responsive to said second reference signal and said detected intensity signal to generate a second driving current which, when supplied to said laser causes said laser to generate a beam having a second intensity level, a first D/A converter having an input terminal, an output terminal and a gain control terminal and operative to provide a signal at said output terminal whose level varies relative to that of a signal applied to said input terminal in accordance with the level of a signal applied to said gain control terminal, a source of an image density signal and means for applying said image density signal as an input to said first D/A converter, means for applying to said gain control terminal a control signal which is a function of the levels of said first and second driving currents, and means for applying driving current to said laser which varies as a function of the signal at said output terminal of said D/A converter.

* * * * *